United States Patent [19]

Hoffmann

[11] Patent Number: 4,933,261

[45] Date of Patent: Jun. 12, 1990

[54] ELEMENT HAVING A LAYER CONTAINING A MIXTURE WHICH CAN BE CROSSLINKED BY PHOTOPOLYMERIZATION

[75] Inventor: Gerhard Hoffmann, Otterstadt, Fed. Rep. of Germany

[73] Assignee: BASF Aktiengesellschaft, Ludwigshafen, Fed. Rep. of Germany

[21] Appl. No.: 398,964

[22] Filed: Aug. 28, 1989

Related U.S. Application Data

[62] Division of Ser. No. 275,670, Nov. 23, 1988.

[30] Foreign Application Priority Data

Oct. 17, 1985 [DE] Fed. Rep. of Germany ....... 3536957

[51] Int. Cl.$^5$ ................................................. G03C 1/76
[52] U.S. Cl. ..................................... 430/286; 430/281; 430/306; 430/907; 430/912; 522/74
[58] Field of Search ................. 523/714; 430/270, 271, 430/281, 300, 306, 325, 327, 286, 907, 912

[56] References Cited

U.S. PATENT DOCUMENTS

| | | |
|---|---|---|
| 3,897,255 | 7/1975 | Erickson . |
| 4,001,174 | 10/1975 | Yagi et al. . |
| 4,045,231 | 8/1977 | Toda et al. . |
| 4,201,642 | 5/1980 | Nowak . |
| 4,339,527 | 7/1982 | Hill . |
| 4,369,246 | 1/1983 | Chen et al. . |
| 4,400,460 | 8/1983 | Fickes et al. . |
| 4,452,879 | 6/1984 | Fickes et al. . |
| 4,636,453 | 1/1987 | Keys et al. . |

FOREIGN PATENT DOCUMENTS

| | | |
|---|---|---|
| 0217324 | 4/1987 | European Pat. Off. . |
| 1095518 | 12/1967 | United Kingdom . |
| 1366769 | 9/1974 | United Kingdom . |

OTHER PUBLICATIONS

Ullmanns Enzyklopadie der Technischen Chemie, vol. 9, No. 4, Aug. 4, 1975, pp. 480–481.
Kirk-Othmer. Encyclopedia of Chemical Technology, vol. 5, No. 3, 1979, pp. 786, 790.

*Primary Examiner*—Jack P. Brammer
*Attorney, Agent, or Firm*—Keil & Weinkauf

[57] ABSTRACT

Mixtures which can be cross-linked by photopolymerization and are based on soluble elastomeric block copolymers, photopolymerizable monomers which are compatible with these, photoinitiators and plasticizers contain, as the plasticizer, a chloroalkane of 8 to 40 carbon atoms which has a chlorine content of from 30 to 73% by weight.

5 Claims, No Drawings

ELEMENT HAVING A LAYER CONTAINING A MIXTURE WHICH CAN BE CROSSLINKED BY PHOTOPOLYMERIZATION

This is a division of application Ser. No. 275,670, filed Nov. 23, 1988, now allowed.

The present invention relates to mixtures which can be crosslinked by photopolymerization and are based on soluble elastomeric block copolymers, photopolymerizable monomers which are compatible with these, photoinitiators and plasticizers, the said mixtures having improved performance characteristics, in particular improved tensile strength in the photocrosslinked state.

Mixtures based on soluble, elastomeric block copolymers, photopolymerizable monomers which are compatible with these, photoinitiators and plasticizers are disclosed in, for example, British Patent 1,366,769. The plasticizers used there are oily hydrocarbons, for example naphthenic or paraffinic oils, polymers and resins, eg. polystyrene, α-methylstyrene/vinyltoluene copolymers, polyterpene resins or polyethylene, or stearic acid. However, mixtures of this type possess very disadvantageous performance characteristics, ie. cracking during processing, storage and use of the photopolymerizable materials and forms which have been prepared from these crosslinkable mixtures. Cracking constitutes a considerable problem, particularly in the case of printing plates, since it greatly reduces the shelf life and reusability of the printing plates and gives substantially poorer printed products.

Furthermore, British Patent 1,095,518 discloses that chlorohydrocarbons having a boiling point above 300° C. can be used as plasticizers in layers of colloidal rubbers and aryl azides. No information is given concerning the tensile strength of these layers after they have been exposed.

It is an object of the present invention to provide novel mixtures which can be crosslinked by photopolymerization, do not have the above disadvantage and permit the production of materials and forms, in particular printing plates, which are crosslinked by photopolymerization and have a high tensile strength.

We have found that this object is achieved by mixtures which are crosslinkable by photopolymerization and are based on soluble elastomeric block copolymers, photopolymerizable monomers which are compatible with these, photoinitiators and plasticizers, the said mixtures containing, as the plasticizer, a chloroalkane of 8 to 40 carbon atoms which has a chlorine content of from 30 to 73% by weight.

In view of the prior art, it was surprising that the chloroalkanes used according to the invention have an excellent plasticizing action and moreover effectively suppress crack formation in the materials and forms prepared from the novel mixtures and crosslinked by photopolymerization.

For the purposes of the present invention, substances are designated as soluble when they dissolve in conventional developers for materials and forms crosslinked by photopolymerization, and they are designated as compatible when they are capable of remaining dispersed in one another. The term materials designates materials of any external shape, for example adhesives, sealants or films, which do not contain imagewise information, whereas the term forms is understood as meaning materials which contain imagewise information, eg. printing plates and photoresists.

The novel chloroalkanes are of 8 to 40, preferably 11 to 35, in particular 12 to 30, carbon atoms and contain from 30 to 73% by weight of chlorine. It is possible to use the pure chloroalkanes, such as trichloro-n-octane or its isomers (chlorine content: 48.9% by weight) or, for example, octachloro-n-octane or its isomers (chlorine content: 72.8% by weight), but the industrially produced mixtures of various chloroalkanes, as obtained, for example, in the chlorination of hydrocarbons having a boiling range of from 195° to 220° C. or from 280° to 320° C. in the Fischer-Tropsch synthesis, or of wax-like hydrocarbons which are usually referred to as paraffin waxes or hard paraffins, are preferred. Chloroalkanes of this type are commercial products and it has become customary to refer to them as chloroparaffins. They are oils or solids having softening points of $\leq 100°$ C. and a density of from 1.03 to 1.6 g cm$^{-3}$, depending on the chlorine content. Advantageously, they are used in amounts of from 3 to 22, in particular from 8 to 18, % by weight, based on the mixtures which can be crosslinked by photopolymerization, the oils being preferred.

Soluble elastomeric block copolymers are conventionally used in mixtures which can be crosslinked by photopolymerization. Vinylaromatic/diene block copolymers are particularly useful for this purpose, those formed by chemical bonding of three or more elastomeric diene polymer blocks or of one or more elastomeric diene polymer blocks and two or more vinylaromatic polymer blocks or of two or more elastomeric diene polymer blocks and one or more vinylaromatic polymer blocks being advantageous. In particular, those in which the vinylaromatic is styrene and the diene is butadiene and/or isoprene are especially advantageous. Moreover, such block copolymers may be chemically bonded to even larger block copolymer systems via suitable polyvalent atoms or ions and inorganic, organic or organometallic molecular moieties. The term chemical bonding is understood as being the generation of covalent chemical bonds, preferably carbon-carbon single bonds, between the polymer blocks in the course of synthesis of the block copolymer. Block copolymers of this type are disclosed in German Laid-Open Applications DOS 2,815,678, DOS 2,939,989 and DOS 2,942,183 and British Patent 1,366,769; they are prepared by sequential anionic polymerization. Some or all of their olefinic and aromatic bonds, or only their olefinic bonds in the diene polymer blocks, can then be hydrogenated. The mixtures according to the invention contain the block copolymers, individually or as a mixture, in an amount of from 92 to 58, advantageously from 85 to 65, in particular from 82 to 68, % by weight, based on the mixture. Small amounts of other polymers, in particular elastomers, may also be mixed with them.

Conventional compatible photopolymerizable monomers are disclosed in, for example, U.S. Pat. Nos. 2,760,863 and 3,060,023. They have a boiling point above 100° C. under atmospheric pressure and a molecular weight of up to 3000, in particular up to 2000. Suitable substances are the esters of acrylic acid and/or methacrylic acid with monohydric or polyhydric alcohols, eg. butyl acrylate, butyl methacrylate, 2-ethylhexyl acrylate, lauryl (meth)acrylate, ethylene glycol di(meth)acrylate, butane-1,4-diol di(meth)acrylate, neopentylglycol di(meth)acrylate, 3-methylpentanediol di(meth)acrylate, 2-hydroxypropyl (meth)acrylate, 2-hydroxyethyl (meth)acrylate, hexane-1,6-diol di(meth)acrylate, 1,1,1-trimethylolpropane tri(meth)acrylate, di-, tri- and tetraethylene glycol di(meth)acrylate, tripropylene glycol di(meth)acrylate or pentaerythritol tetra(meth)acrylate, the vinyl esters of aliphatic monocarboxylic acids, eg. vinyl oleate, the vinyl ethers of alcohols, eg. octadecyl vinyl ether and butane-1,4-diol divinyl ether, the diesters of fumaric and maleic acid, and the reaction products of OH-terminated, oligomeric polybutadienes with maleic acid or (meth)acrylic acid, ie. oligomeric polybutadienes possessing activated, photopolymerizable olefinic double bonds. They are present in the novel mixtures, individually or mixed with one another in an amount of from 2 to 16, advantageously from 4 to 14, in particular from 5 to 12, % by weight, based on the mixture.

Examples of conventional compatible photoinitiators are benzoin and benzoin derivatives, such as its methyl, isopropyl, n-butyl or isobutyl ethers, symmetrically or asymmetrically substituted benzil acetals, such as benzil dimethyl acetal or benzil 1-methyl 1-ethyl acetal, acyldiarylphosphine oxides according to German Laid-Open Application DOS 2,909,992 and substituted and unsubstituted quinones, such as ethylanthraquinone, benzanthraquinone, benzophenone or 4,4'-bis-(dimethylamino)benzophenone. They can be used alone or as a mixture with one another or in combination with coinitiators, eg. ethylanthraquinone with 4,4'-bis-(dimethylamino)-benzophenone, benzoin methyl ether with triphenylphosphine, diacylphosphine oxides with tertiary amines or acyldiarylphosphine oxides with benzil dimethyl acetal. They are used in the novel mixtures in an amount of from 0.4 to 6, advantageously from 0.7 to 4, in particular from 1.2 to 2.5, % by weight, based on the mixture.

In addition to the chloroalkanes, the novel mixtures may also contain other plasticizers, for example modified and unmodified natural oils and resins, such as paraffinic or naphthenic oils and mineral oil resins or pentaerythritol esters of hydrogenated rosin; esters of alkyl, alkenyl, aralkyl or arylalkenyl alcohols with acids such as citric acid, acetic acid, propionic acid, butyric acid, ethylbutyric acid, ethylhexanoic acid, glycolic acid, benzoic acid, phthalic acid, trimellitic acid, abietic acid, phosphoric acid or stearic acid; synthetic oligomers or resins, such as oligostyrene, oligomeric styrene/butadiene copolymers, oligo-α-methylstyrene, oligomeric α-methylstyrene/vinyltoluene copolymers, liquid 1,2- or 1,4-oligobutadienes, oligopentadienes, liquid oligomeric acrylonitrile/butadiene copolymers and polyterpene, polyacrylate, polyester or polyurethane resins, and synthetic polymers, such as polyethylene or ethylene/propylene/diene rubbers. Conventional amounts are from 3 to 25% by weight, based on the novel mixture.

Mixtures according to the invention may furthermore contain other conventional assistants and/or additives.

These include, in particular, thermal polymerization inhibitors, which are generally added in an amount of from 0.001 to 2% by weight, based on the mixture. The precondition for selecting inhibitors of this type is the lack of any significant self-absorption in the actinic range in which the photoinitiator absorbs. Suitable substances are hydroquinone, p-methoxyphenol, 2,6-di-tert-butyl-p-cresol, β-naphthol, phenothiazine, pyridine, nitrobenzene, m-dinitrobenzene or chloranil; thiazine dyes, such as Thionine Blue G (C.I. 52025), Methylene Blue B (C.I. 52015) or Toluidine Blue (C.I. 52040), and N-nitrosamines, such as N-nitrosodiphenylamine, and the salts, for example the potassium or aluminum salts, of N-nitrosocyclohexylhydroxylamine.

To control the exposure properties, dyes, pigments or photochromic additives in an amount of from 0.0001 to 2% by weight, based on the mixture, may be added to the mixtures according to the invention. However, additives of this type may also be used for identification purposes, direct monitoring of the result of exposure or esthetic purposes. A precondition for the choice and amount of such additives is that they interfere with the photopolymerization of the mixtures to just as small an extent as the thermal polymerization inhibitors.

Agents for improving the relief structure of the printing plates prepared from the novel mixtures, eg. 9,9'-dianthronyl and 10,10'-bisanthrone, according to German Laid-Open Application DOS 2,720,560, may also be added.

The novel mixtures may furthermore contain crosslinking assistants, such as the trifunctional and tetrafunctional mercapto compounds described in U.S. Pat. Nos. 4,179,531 and 4,234,676.

To protect the novel mixtures from decomposition by oxidation and thermal oxidation by atmospheric oxygen, effective amounts of conventional antioxidants may be added to them, for example sterically hindered monophenols, such as 2,6-di-tert-butyl-p-cresol, alkylated thiobisphenols and alkylidenebisphenols, such as 2,2-methylenebis-(4-methyl-6-tert-butylphenol) or 2,2-bis(1-hydroxy-4-methyl-6-tert-butylphenyl) sulfide, hydroxybenzyls, such as 1,3,5-trimethyl-2,4,6-tris-(3,5-di-tert-butyl-4-hydroxybenzyl)-benzene, triazines, such as 2-(4-hydroxy-3,5-tert-butylanilino)-4,6-bis-(n-octylthio)-1,3,5-triazine, polymerized trimethyldihydroquinone, dibutylzinc dithiocarbamate, dilauryl thiodipropionate and phosphites, such as tris(nonylphenyl) phosphite.

The novel mixtures may furthermore contain conventional immiscible polymeric or nonpolymeric organic and inorganic fillers or reinforcing fillers which are essentially transparent at the wavelengths of the light used for exposing the novel mixtures and do not scatter this light, and whose refractive index is substantially matched up with that of the mixture in question. Suitable substances of this type are polystyrene, organophilic silica, bentonite, silica, organophilic alumina, glass powder, colloidal carbon and various types of dyes and pigments. These additives are used in amounts which vary with the properties desired for the materials according to the invention. The fillers have the advantage that they improve the strength of the novel mixtures, help to reduce tack and may be effective as color-imparting agents.

The mixtures according to the invention may also contain a flux, such as calcium stearate and/or a mold release agent, such as talc, in effective amounts and, where required, antiozonants, eg. antiozone waxes, which are familiar to the skilled worker.

When the novel mixtures are used as photopolymerizable adhesives and sealants, it is advisable to add tackifying resins, eg. paraffin resins, rosin esters, polyterpenes, cumarone/indene resins or compounds according to U.S. Pat. No. 4,133,731.

The amount of additives and/or assistants should not in general exceed 20, in particular 10, % by weight, based on the mixture according to the invention.

The method for the preparation of the novel mixtures from the components has no special features; the conventional kneading, mixing and dissolution techniques can be used.

The novel mixtures thus obtained can be used directly as photopolymerizable adhesives and sealants or can be further processed to give photopolymerized films and forms, in particular printing plates. To do this, they are shaped in a conventional manner, by casting from a solution, hot pressing, calendering or extruding, to give sheet-like structures of the desired thickness. In the case of the forms, this depends primarily on the intended use of the printing plate to be produced and generally varies from 0.2 to 7 mm, in particular from 0.7 to 6.5 mm, since printing plates of this thickness are suitable for the majority of printing techniques. Films may be of any thickness.

The sheet-like structures can be processed as such to give printing plates; however, they are usually produced as a laminate with other layer-like materials before being further processed. Such a laminate is generally referred to as a multilayer element, and the sheet-like structure present therein is generally referred to as the relief-forming layer (RL).

Usually, a multilayer element of this type contains a relief-forming layer (RL) which is firmly bonded to a dimensionally stable base (B). The said base (B) in turn may possess a flexible and resilient under-layer (U) underneath, as described in German Laid-Open Application DOS 2,444,118.

Furthermore, a top layer (TL) and/or a cover sheet (CS) may be applied to that side of the layer (RL) which faces away from the base (B). If a top layer (TL) and a cover sheet (CS) are used together, (TL) is located directly on top of the layer (RL), and an antiadhesion layer (AAL) may also be present between (TL) and (CS). Furthermore, an adhesive bond can be produced between (B) and (RL) and, if required, between (RL) and (CS) with the aid of an adhesive layer (AL).

Sheets, foils or sleeves of metal, such as steel, aluminum, copper or nickel, or of high polymers, such as polyethylene terephthalate, polybutylene terephthalate, nylon or a polycarbonate, are conventionally used as dimensionally stable bases (B). Woven and nonwoven fabrics, for example glass fiber fabrics, or reinforced materials of, for example, glass fibers and high polymers such as polyethylene terephthalate, are also suitable.

A 0.5–40 μm thick layer of a mixture of adhesive-forming components, as described in German Laid-Open Applications DOS 3,100,175 or DOS 3,107,741 is usually used as the adhesive layer (AL).

Conventional top layers (TL) are from 0.5 to 20 μm thick and may consist of a polymer which forms a soluble, nontacky, transparent film having a high tensile strength, eg. nylon, a nylon copolymer, polyurethane, polyvinyl alcohol, polyvinylpyrrolidone, polyethylene oxide having a molecular weight higher than $10^5$ or a cyclic rubber having a high degree of cyclization. (TL) can, if required, be matted.

Conventional cover sheets (CS) are from 20 to 150 μm thick and consist of a polymer such as nylon or polyethylene terephthalate.

Conventional antiadhesion layers (AAL) are from 0.1 to 0.5 μm thick and consist of, for example, silicone resins as described in European Patent 68,599.

If highly reflective sheets or foils are used as bases (B), they may contain conventional antihalation agents, such as carbon black or manganese dioxide. However, the antihalation agents may also be applied as a separate layer on (B) or may be present in the adhesive layer (AL) or in the relief-forming layer (RL).

The method for the production of such multilayer elements does not have any special features. The said elements are usually produced by applying the relief-forming layer (RL) onto the base (B) by casting from solution, hot pressing, calendering or extruding. The other layers can then be applied to this two-layer element in a conventional manner. However, it is also possible first to apply the layer (RL) to that side of a cover sheet (CS) which is covered with a top layer (TL) and then to bond the uncovered side of the layer (RL) to the base (B).

The sheet-like structures which consist of the novel mixtures, or the multilayer elements which contain relief-forming layers (RL) of such mixtures, can be converted to printing plates and photopolymerized films in a conventional manner. This conversion of printing plates which can be crosslinked by photopolymerization into printing plates which have been crosslinked by photopolymerization has no special features in terms of method, even where the novel mixtures are used. It is effected, if necessary after a pretreatment, by imagewise exposure of the printing plates to actinic light having a wavelength of from 230 to 450 nm, advantageously from 300 to 450 nm, through a superposed photographic negative, washing out of the unexposed and hence uncrosslinked parts of the printing plates using suitable developers, drying the resulting printing plates which consist or contain a relief layer (RL') and, if required, aftertreatment of the printing plates.

Examples of conventional pretreatment procedures consist in peeling off any cover sheet (CS) present in a multilayer element or uniform exposure of the relief-forming layer (RL) to actinic light from the back, ie. from that side which faces away from the subsequent printing surface. Examples of suitable sources of actinic light are sunlight and commercial UV fluorescent tubes, medium pressure, high pressure and low pressure mercury lamps, superactinic fluorescent tubes, pulsed xenon lamps, lamps doped with metal iodides and carbon arc lamps.

Suitable developers are conventional solvents, such as aromatic hydrocarbons, eg. toluene or ethylbenzene, chloroalkanes, eg. 1,1,1-trichloroethane, 1,1,2,2-tetrachloroethane or tetrachloroethylene, ketones, eg. methyl isobutyl ketone or mixtures of such solvents with one another or with lower alcohols, eg. n-butanol, the latter serving to control the washout action.

Conventional aftertreatment procedures comprise uniform postexposure of the printing plates or treatment of their surfaces with halogen-containing baths, followed by washing, drying and, if necessary, postexposure.

The thickness of the relief layer (RL'') of the printing plates varies from 0.2 to 7 mm, depending on the intended use. For flexographic printing, layer thicknesses of from 0.7 to 6.5 mm are advantageous.

The printing plates obtained in a conventional manner and based on the novel mixtures can be mounted on printing cylinders in a conventional manner, if necessary roughened by corona discharge and used for continuous printing.

Of course, photopolymerized materials, eg. films, are produced by uniform exposure to actinic light, the further process steps being omitted in this case.

The mixtures according to the invention have a large number of advantages in terms of their preparation and processing. For example, because of their low melt viscosity, they can very easily be processed by conventional methods; in particular, the fact that they can easily be metered in the form of crumbs facilitates charging of extruders, generally making the use of parting agents superfluous. The processed materials and forms are clear and transparent which permits, in particular, the production of printing plates with relief layers (RL') which have very great relief depth and a straight side wall structure. This is absolutely essential for printing a rough, wavy surface, for example that of corrugated board, cardboard articles or napkins. Relief heights of more than 3 mm can therefore be produced without problems, as in the case of conventionally embossed rubber blocks, and without subsequent polymerization taking place toward the bottom of the layer. Not least, the transparency of the novel mixtures permits short exposure times without this resulting in an unacceptable polymerization gradient in the relief layers (RL'). The exposed materials and forms are stable to external chemical and physical influences. In particular, the printing plates are highly resistant to printing ink solvents and have high abrasion resistance, which permits very long print runs. However, the main advantage of the processed materials and forms produced from the novel mixtures and of the exposed materials and forms based on these mixtures is their extremely low tendency to crack.

In the Examples below, the Shore A hardness according to DIN 53,505, the resilience in percent according to DIN 53,512 and the swelling of the samples, in % by weight, after treatment for 24 hours with a solvent mixture consisting of 7 parts by weight of ethanol and 3 parts by weight of ethyl acetate, were determined. The tendency to crack was determined in an ozone chamber at an ozone concentration of 50 ppm and at 25° C. on 10 cm long samples which had been subjected to 10% elongation; the criterion here was the period after which the first cracks appeared.

EXAMPLE 1

88,00 g of a styrene/isoprene/styrene three-block copolymer according to Example IV of British Patent 1,366,769, having a number average molecular weight of 130,000, 3.55 g of hexanediol diacrylate, 1.75 g of hexanediol dimethacrylate, 1.25 g of benzil dimethyl acetal, 5.30 g of a chloroalkane having a chlorine content of 49% and a density of 1.24 gcm$^{-3}$, 5.30 g of an oligomer of 70 parts of vinyltoluene and 30 parts of α-methylstyrene, 0.53 g of 2,6-di-tert-butyl-p-cresol and 0.006 g of Solvent Black 3 (C.I. 26150)

were dissolved in 114.4 g of toluene at 90° C. The solution was applied, by means of a knife coater, onto the coated side of a biaxially oriented polyethylene terephthalate film coated with a commercial nylon copolymer (Macromelt from Henkel) so that, after the layer had been dried at 80° C. for 1 hour, a 0.7 mm thick film remained. The multilayer element obtained in this manner was exposed uniformly for 30 minutes in a commercial flat-plate exposure unit (40 watt, UV fluorescent lamps). The resulting photopolymerized layer of the exposed multilayer element was a film which had no imagewise information content, possessed a Shore A hardness of 39 and a resilience of 52% and exhibited 7.7% by weight swelling. Cracks occurred after 35 minutes.

COMPARATIVE EXPERIMENT 1

The procedure described in Example 1 was followed, except that the content of the chloroalkane according to the invention was replaced by the same amount of white oil S 5000, a liquid paraffin usually employed as a plasticizer. The photopolymerized layer of this exposed multilayer element was a film which had no imagewise information content, possessed a Shore A hardness of 41 and a resilience of 56% and exhibited 13.7% by weight swelling. The first cracks appeared after only 12 minutes.

COMPARATIVE EXPERIMENT 2

The procedure described in Comparative Experiment 1 was followed, except that 1 g of commercial antiozone wax (Antilux 550 from Rhein-Chemie, Rheinau GmbH) was also added to the material. The Shore A hardness, resilience and swelling of the resulting photopolymerized film without any imagewise information content were similar to the values for Comparative Experiment 1. The first cracks appeared after 25 minutes. This corresponded roughly to a 50% improvement in the tensile strength compared with that of Comparative Experiment 1; the tensile strength of the film according to Example 1 was not reached.

EXAMPLE 2

In the preparation of the novel mixture, the procedure described in Example 1 was followed, except that the amount of chloroalkane was doubled from 5.3 to 10.6 g, and the amount of block copolymer was reduced from 88.00 g to 82.70 g. This mixture according to the invention was used to produce a multilayer element according to German Laid-Open Application DOS 2,444,118, which had a total thickness of 2 mm and possessed, on the upper side, a 0.7 mm thick layer of the novel mixture. The multilayer element was exposed uniformly as described in Example 1. The photopolymerized layer (film) of the multilayer element had a Shore A hardness of 40 and a resilience of 42% and exhibited only 1.9% by weight swelling. Cracks only appeared after 345 minutes; this corresponded to an improvement of more than 1000% over Comparative Experiment 2.

EXAMPLE 3

The novel mixture according to Example 2 was used to produce a multilayer element as described in Example 1, the relief-forming layer (RL) of this element being 1.7 mm thick, compared with 0.7 mm in Example 1.

To produce a flexographic printing plate from this multilayer element, a 75 μm thick polyethylene terephthalate film coated with a mixture of adhesive-forming components was first applied, by roller-coating, onto the free surface of the relief-forming layer (RL). A mixture of an isocyanate-cured phenoxy resin and a polycarbonate according to German Laid-Open Application DOS 3,100,175 was used as the mixture of adhesive-forming components. Thereafter, the polyester cover sheet was removed, the nylon copolymer layer remaining as a protective layer on the surface of the relief-forming layer (RL).

A photographic image-bearing negative was then placed as a transparency on that side of the relief-forming layer (RL) which was covered with the nylon copolymer, and pressed on with a film using a vacuum frame. Thereafter, imagewise exposure was carried out through the photographic negative for 12 minutes using a commercial flat-plate exposure unit (40 watt, UV fluorescent tubes). Simultaneously with the photopolymerization taking place during this process, the dye present in the relief-forming layer (RL) was bleached, thus permitting a direct assessment of the quality of the result of exposure.

The partially photopolymerized relief-forming layer (RL) of the multilayer element was developed in a commercial spray washer for 4.5 minutes at room temperature using a solvent mixture consisting of 9 parts by volume of tetrachloroethylene and 1 part by volume of n-butanol, dried in a through-circulation dryer at 80° C. for one hour, aftertreated for 3 minutes with a 0.4% strength by weight aqueous bromine solution, washed and dried again.

The resulting relief layer (RL) of the flexographic printing plate was postexposed uniformly for 10 minutes and clamped on a printing cylinder which in turn was coated with a 1 mm thick coating of natural rubber having a Shore A hardness of 30.

The nontacky surface of the flexographic printing plate accepted conventional flexographic printing inks in an outstanding manner. The abrasion resistance, swelling and resilience of the printing plate were similar to those of conventional rubber blocks. The print results obtained showed exact reproduction of the original, with crisp details. For its part, the printing plate showed absolutely no damage or cracks even after a print run of 200,000.

We claim:

1. A photopolymerizable element for the production of flexographic relief printing plates comprising a dimensionally stable base and a photopolymerizable elastomeric relief forming layer consisting essentially of
    (a) from 58 to 92% by weight, based on the sum of all the components of the photopolymerizable elastomeric relief-forming layer, of a solvent soluble elastomeric diene block copolymer containing at least one vinylaromatic and at least one diene polymer block,
    (b) from 2 to 16% by weight, based on the sum of all the components of the photopolymerizable elastomeric relief-forming layer, of one or more photopolymerizable, ethylenically unsaturated monomers being compatible with the elastomeric diene block copolymer (a),
    (c) from 0.4 to 6% by weight, based on the sum of all the components of the photopolymerizable elastomeric relief-forming layer, of one or more photoinitiators, and
    (d) from 3 to 22% by weight, based on the sum of all of the components of the photopolymerizable elastomeric relief-forming layer, of a chloroalkane of 8 to 40 carbons which has a chlorine content of about 49% by weight.

2. The photopolymerizable element of claim 1, wherein the chloroalkane has a density of 1.24 g/cm$^3$.

3. The photopolymerizable of claim 2, wherein the chloroalkane is an oil.

4. The photopolymerizable element of claim 1, wherein said photopolymerizable elastomeric relief forming layer contains 68–82% by weight of (a), from 5 to 12% by weight of (b), from 1.2 to 2.5% by weight of (c) and from 8 to 18% by weight of (d).

5. The photopolymerizable element of claim 1, wherein said elastomeric block copolymer is prepared by sequential anionic polymerization.

* * * * *